(12) United States Patent
Colonna et al.

(10) Patent No.: US 12,184,277 B2
(45) Date of Patent: Dec. 31, 2024

(54) SYNTHESIS DRIVEN FOR MINIMUM LEAKAGE WITH NEW STANDARD CELLS

(71) Applicant: STMicroelectronics International N.V., Geneva (CH)

(72) Inventors: Giulia Colonna, Savigliano (IT); Enea Dimroci, Borgo San Dalmazzo (IT)

(73) Assignee: STMicroelectronics International N.V., Geneva (CH)

( * ) Notice: Subject to any disclaimer, the term of this patent is extended or adjusted under 35 U.S.C. 154(b) by 29 days.

(21) Appl. No.: 18/308,215

(22) Filed: Apr. 27, 2023

(65) Prior Publication Data

US 2024/0364336 A1 Oct. 31, 2024

(51) Int. Cl.
  *H03K 19/00* (2006.01)
(52) U.S. Cl.
  CPC ..... *H03K 19/0016* (2013.01); *H03K 19/0013* (2013.01)
(58) Field of Classification Search
  CPC ................ H03K 19/0013; H03K 19/0016
  USPC ........................................................ 327/544
  See application file for complete search history.

(56) References Cited

U.S. PATENT DOCUMENTS

| | | | |
|---|---|---|---|
| 6,998,895 B2 | 2/2006 | Uvieghara | |
| 7,268,590 B2 | 9/2007 | Kao et al. | |
| 9,342,259 B2 | 5/2016 | Bartling et al. | |
| 2006/0145752 A1* | 7/2006 | Kim | H03K 19/0185 327/544 |
| 2008/0106299 A1 | 5/2008 | Oh | |
| 2013/0027125 A1* | 1/2013 | Hoberman | H03K 19/00315 327/544 |
| 2013/0181740 A1 | 7/2013 | Smith et al. | |
| 2017/0331478 A1 | 11/2017 | Stahl et al. | |

FOREIGN PATENT DOCUMENTS

| | | |
|---|---|---|
| CN | 101777907 A | 7/2010 |
| CN | 113098467 A | 7/2021 |

OTHER PUBLICATIONS

Manuzzato, Andrea et al., "Exploiting Body Biasing for Leakage Reduction: A Case Study," 2013 IEEE Computer Society Annual Symposium on VLSI, Aug. 5, 2013, 6 pages.

(Continued)

*Primary Examiner* — William Hernandez
(74) *Attorney, Agent, or Firm* — Slater Matsil, LLP

(57) ABSTRACT

According to an embodiment, an integrated circuit includes a complementary metal-oxide-semiconductor (CMOS) logic gate, a series p-channel transistor, and a shunt n-channel transistor. The CMOS logic gate includes a first p-channel transistor and a first n-channel transistor. The first p-channel transistor and the series p-channel transistor are configurable to be body biased. The series p-channel transistor is coupled between an output terminal of the CMOS logic gate and the first p-channel transistor. The shunt n-channel transistor is coupled between the output terminal of the CMOS logic gate and the reference ground. A gate terminal of the series p-channel transistor is coupled to a gate terminal of the shunt n-channel transistor and configured to receive a sleep signal during a low-power operating mode of the CMOS logic gate.

20 Claims, 6 Drawing Sheets

(56) References Cited

OTHER PUBLICATIONS

Meijer, R.I.M.P., "Body bias aware digital design: A design strategy for area and performance-efficient CMOS integrated circuits," Eindhoven: Technische Universiteit Eindhoven, Jan. 1, 2011, 170 pages.
Extended European Search Report, EP Application No. 24165843.4-1201, mailed Sep. 30, 2024, 12 pages.
Lorenzo Rohit et al., "Dynamic Threshold Sleep Transistor Technique for High Speed and Low Leakage in CMOS Circuits", Circuits, Systems and Signal Processing, Cambridge, MS, US, vol. 36, No. 7, Oct. 24, 2016, pp. 2654-2671, XP036243876, ISSN: 0278-081 X, DOI: 10.1007/S00034-016-0442-0.
Udayanga G.W.G.K.N et al., "Minimum leakage vector with sparse power gating-a combinational approach for standby leakage power reduction in CMOS circuits", 2019 IEEE International Circuits and Systems Symposium (ICSYS), IEEE, Sep. 18, 2019, pp. 1-6, XP0337 45130, DOI: 10.1109/ICSYS47076.2019.9045929.

* cited by examiner

- PRIOR ART -

- PRIOR ART -

- PRIOR ART -

- PRIOR ART -

SYNTHESIS DRIVEN FOR MINIMUM LEAKAGE WITH NEW STANDARD CELLS

TECHNICAL FIELD

The present disclosure generally relates to electronic circuits and, in particular embodiments, to current leakage reduction in integrated circuits.

BACKGROUND

A commonly used type of semiconductor device in digital electronics is an integrated circuit (IC) with complementary metal-oxide-semiconductor (CMOS) technology. Generally, CMOS allows for low power consumption, making it ideal for battery-powered applications and devices that involve low-power operation. In a CMOS IC, each logic gate is constructed using complementary pairs of n-type and p-type metal-oxide-semiconductor field effect transistors (MOSFETs).

Logic circuits are the building blocks of digital electronics and are used in a wide range of digital systems, such as microprocessors, memory chips, and other digital logic circuits. Logic circuits are electronic circuits that perform logic operations on one or more binary inputs to produce a binary output. Examples of logic circuits include logic gates (e.g., AND, OR, and NOT gates) and adders. These circuits can perform various operations, such as arithmetic and logic operations (e.g., addition, subtraction, multiplication, etc.).

Logic circuits can be implemented using CMOS technology, where current leakage is an important consideration, as it can lead to excess power consumption and reduced circuit reliability. Current leakage can result from subthreshold leakage, gate leakage, junction leakage, drain-induced barrier lower (DIBL), or the like.

Body biasing is a technique used to reduce current leakage in integrated circuits. In body biasing, an appropriate bias voltage is applied to the transistor, resulting in a change in the transistor's threshold voltage. In forward body biasing (FBB), the bias voltage is higher than the source voltage, causing an increase in the transistor's threshold voltage, making it harder for current to flow through the transistor when the transistor is in the OFF state, and, thus, reducing subthreshold leakage. In reverse body biasing (RBB), the bias voltage is less than the source voltage, causing a decrease in the transistor's threshold voltage, making it easier for current to flow through the transistor when it is in the ON state, and reducing the resistance and the voltage drop across the transistor and, thus, reducing junction leakage.

Although body biasing can be used in both n-channel and p-channel transistors, any reduction in current leakage from body biasing in the n-channel transistor is countered by the increased power consumption of the circuit. Further, the body biasing for the n-channel transistor requires a negative voltage source, which adds additional cost and footprint overhead to the circuit. A method, circuit, and device with reduced current leakage are, thus, desirable.

SUMMARY

Technical advantages are generally achieved by embodiments of this disclosure which describe current leakage reduction in integrated circuits.

A first aspect relates to an integrated circuit. The integrated circuit includes a complementary metal-oxide-semiconductor (CMOS) logic gate, a series p-channel transistor, and a shunt n-channel transistor. The CMOS logic gate includes a first p-channel transistor and a first n-channel transistor. The first p-channel transistor and the series p-channel transistor are configurable to be body biased. The series p-channel transistor is coupled between an output terminal of the CMOS logic gate and the first p-channel transistor. The shunt n-channel transistor is coupled between the output terminal of the CMOS logic gate and the reference ground. A gate terminal of the series p-channel transistor is coupled to a gate terminal of the shunt n-channel transistor and configured to receive a sleep signal during a low-power operating mode of the CMOS logic gate.

A second aspect relates to a complementary metal-oxide-semiconductor (CMOS) logic gate. The CMOS logic gate includes a first p-channel transistor, a first n-channel transistor, a series p-channel transistor, and a shunt n-channel transistor. The first p-channel transistor is coupled between a voltage source terminal of the CMOS logic gate and an output terminal of the CMOS logic gate. The first p-channel transistor and the series p-channel transistor are configured to be body biased. The first n-channel transistor is coupled between the output terminal and reference ground. The series p-channel transistor is coupled between the output terminal and the first p-channel transistor. The shunt n-channel transistor is coupled between the output terminal and reference ground. A gate terminal of the series p-channel transistor is coupled to a gate terminal of the shunt n-channel transistor and configured to receive a sleep signal during a low-power operating mode of the CMOS logic gate.

A third aspect relates to a device having an integrated circuit. The integrated circuit includes a complementary metal-oxide-semiconductor (CMOS) logic gate, a series p-channel transistor, and a shunt n-channel transistor. The CMOS logic gate includes a first p-channel transistor and a first n-channel transistor. The first p-channel transistor and the series p-channel transistor are configurable to be body biased. The series p-channel transistor is coupled between an output terminal of the CMOS logic gate and the first p-channel transistor. The shunt n-channel transistor is coupled between the output terminal of the CMOS logic gate and the reference ground. A gate terminal of the series p-channel transistor is coupled to a gate terminal of the shunt n-channel transistor and configured to receive a sleep signal during a low-power operating mode of the CMOS logic gate.

Embodiments can be implemented in hardware, software, or in any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of complementary metal-oxide-semiconductor (CMOS), it should also be appreciated that these inventive aspects may also apply to other types of transistors. Further, the inventive concepts may be applied to other operating modes, not limited to a low-power mode or standby mode of a device, an integrated circuit, or a transistor.

Embodiments of this disclosure provide an improved cell architecture in integrated circuits that advantageously reduces current leakage and power consumption in low-power operating modes (e.g., sleep mode, standby mode, etc.) while maintaining the functional modes of the integrated circuit during full-power operating modes.

Figure 1:
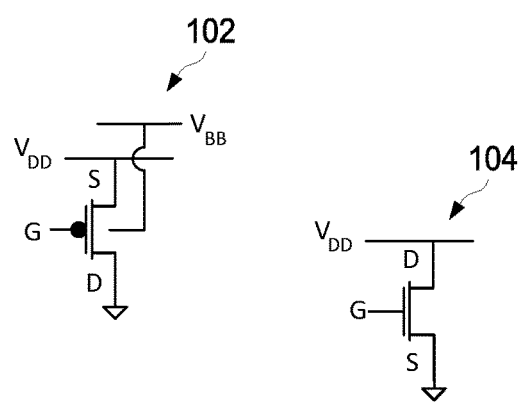
FIG. 1 is a schematic of a conventional p-channel transistor and a conventional n-channel transistor of the metal-oxide-semiconductor type.

FIG. 1 illustrates a schematic of a conventional p-channel transistor 102 and a conventional n-channel transistor 104 of the metal-oxide-semiconductor type. Each transistor 102, 104 includes a gate (G) terminal, a drain (D) terminal, and a source(S) terminal. P-channel transistor 102 is body biased using the bias voltage source $V_{BB}$ coupled to the body of the p-channel transistor 102. The source terminal of the p-channel transistor 102 and the drain terminal of the n-channel transistor 104 are coupled to a voltage source $V_{DD}$. The drain terminal of the p-channel transistor and the source terminal of the n-channel transistor 104 are coupled to reference ground. In embodiments, the voltage of the bias voltage source $V_{BB}$ is greater than the voltage at the voltage source $V_{DD}$.

The static power consumption ($P_{static}$), or leakage power, is caused by leakage current ($I_{static}$) present in an active circuit. In a transistor coupled between voltage source $V_{DD}$ and reference ground, the leakage power can be represented as $P_{static}=I_{static} \times V_{DD}$. Generally, the gate current leakage ($I_{gate}$) and the subthreshold leakage current ($I_{off}$) from the transistor in the OFF condition contribute to the leakage current ($I_{static}$), or $I_{static}=I_{gate}+I_{off}$. In an integrated circuit manufactured using 65 nanometers (nm) technology or greater (e.g., 90 nm, 110 nm, etc.), the contribution from the gate current leakage ($I_{gate}$) is negligible and can be ignored. The subthreshold leakage current ($I_{off}$) can be represented as $$I_{off} = I_0 \times e^{\frac{-V_{th}}{\mu V_t}},$$

where $I_0$ is a constant value that depends on various properties of the transistor (e.g., effective transistor width and length dimensions, gate oxide capacitance, carrier mobility), μ is the subthreshold swing coefficient, Vin is the threshold voltage, and $V_t$ is the thermal voltage of the transistor.

An integrated circuit, such as an application-specific integrated circuit (ASIC), having logic gate(s) based on complementary metal-oxide-semiconductor (CMOS) technology includes one or more of each p-channel transistor 102 and n-channel transistor 104. Generally, any combinational Boolean expression can be represented using universal gates of a logic NAND gate, a logic NOR gate, or a combination thereof.

For example, a single-input logic NOT gate can be represented using a two-input logic NAND gate or a two-input logic NOR gate with the two inputs tied together. As another example, a two-input logic AND gate can be represented using a combination of a two-input logic NAND gate and a single-input logic NOT gate, a pair of two-input logic NAND gates, or three two-input logic NOR gates. As yet another example, a logic OR gate can be represented using a combination of a two-input logic NOR gate and a single-input logic NOT gate or a combination of a two-input logic NOR gate and a two-input logic NAND gate.

Embodiments of this disclosure provide an improved architecture for the logic gate to reduce leakage current ($I_{static}$) by implementing body biasing on the p-channel transistors and adding a series p-channel transistor to the pMOS cloud (i.e., the portion of the logic gate that includes one or more p-channel transistors) and a shunt n-channel transistor to the nMOS cloud (i.e., the portion of the logic gate that includes one or more n-channel transistors). The reduction of leakage current is advantageous to most integrated circuits, but especially so in, for example, ultra-low power ASICS.

Aspects of this disclosure, provide that the series p-channel transistor and the shunt n-channel transistor include a gate terminal coupled to a selectively controlled sleep input signal. The sleep input when at a logic high, disables the series p-channel transistor and enables the shunt n-channel transistor to advantageously reduce leakage current in the logic gate. The sleep input when at a logic low, enables the series p-channel transistor (i.e., pass-through) and disables the shunt n-channel transistor (i.e., OFF), such that the improved logic gate functionally operates identically to the conventional logic gate. These and further details are discussed in greater detail below.

Figure 2:
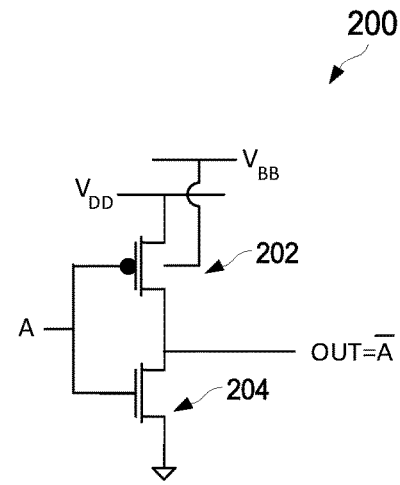
FIG. 2 is a schematic of a conventional CMOS single-input logic NOT (inverter) gate with body biasing applied to the p-channel transistor.

FIG. 2 illustrates a schematic of a conventional CMOS single-input logic NOT (inverter) gate 200 with body biasing applied to the p-channel transistor 202. A NOT gate reverses the input logic state. Logic NOT gate 200 includes a p-channel transistor 202 (e.g., pMOS) coupled in series with an n-channel transistor 204 (e.g., nMOS).

P-channel transistor 202 is coupled between the voltage source $V_{DD}$ and the output terminal (OUT). N-channel transistor 204 is coupled between the output terminal (OUT) and reference ground. The drain terminals of the p-channel transistor 202 and the n-channel transistor 204 are coupled to the output terminal (OUT). P-channel transistor 202 is body biased using the bias voltage source $V_{BB}$ coupled to the body of the p-channel transistor 202. In embodiments, the single-input of the logic NOT gate 200 is coupled to the gate terminals of p-channel transistor 202 and n-channel transistor 204.

Table I illustrates the truth table for the single-input logic NOT gate 200 and corresponding current leakages in the different modes of operation.

TABLE I

| INPUT (A) | OUTPUT | $I_{static}$ | $I_{static}$ (significant contribution) |
|---|---|---|---|
| 0 | 1 | $I_{gate\_pMOS} + I_{off\_nMOS}$ | $I_{off\_nMOS}$ |
| 1 | 0 | $I_{gate\_nMOS} + I_{off\_pMOS}$ | $I_{off\_pMOS}$ |

When a logic low (e.g., "0") input is applied to the logic NOT gate 200, p-channel transistor 202 is ON and n-channel transistor 204 is OFF. Under this condition, the output logic (OUT) is a logic high (e.g., "1")—the first row of Table I. The current leakage corresponding to this mode equals the gate current leakage ($I_{gate\_pMOS}$) from the p-channel transistors 202 and the subthreshold leakage current ($I_{off\_nMOS}$) contribution from the n-channel transistor 204 in the OFF condition, or $I_{gate\_pMOS} + I_{off\_nMOS}$.

When a logic high (e.g., "1") input is applied to the logic NOT gate 200, p-channel transistor 202 is OFF and n-channel transistor 204 is ON. Under this condition, the output logic (OUT) is a logic low (e.g., "0")—the lowest row of Table I. The current leakage corresponding to this mode equals the gate current leakage ($I_{gate\_nMOS}$) from the n-channel transistors 204 and the subthreshold leakage current ($I_{off\_pMOS}$) contribution from the p-channel transistor 202 in the OFF condition, or $I_{gate\_nMos} + I_{off\_pMOS}$.

As the n-channel transistor 204 is not body biased, the subthreshold leakage current ($I_{off\_nMOS}$) contribution from the n-channel transistor 204 in the OFF condition is (exponentially) greater than the subthreshold leakage current ($I_{off\_pMOS}$) contribution from the p-channel transistor 202 in the OFF condition.

The third column in Table I summarizes the contributing factor to the current leakage in the logic NOT gate 200 in the different modes. In an integrated circuit manufactured using 65 nm technology or greater, the contribution from the gate current leakage is negligible. The fourth column in Table I, thus, summarizes the significant contributions to the current leakage in the Logic NOT gate 200 in the different modes. Embodiments of this disclosure provide an improved cell structure that reduces the subthreshold leakage current contribution from, for example, the n-channel transistor 204 in the OFF state.

Figure 3:
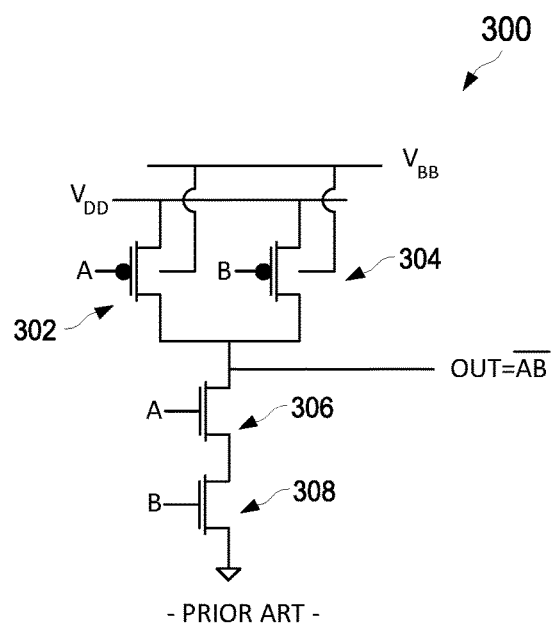
FIG. 3 is a schematic of a conventional CMOS two-input logic NAND (NOT-AND) gate with body biasing applied to the p-channel transistors.

FIG. 3 illustrates a schematic of a conventional CMOS two-input logic NAND (NOT-AND) gate 300 with body biasing applied to the p-channel transistors 302, 304. The output of the Logic NAND gate 300 is logic low (e.g., "0") only when the inputs are logic high (e.g., "1"). Logic NAND gate 300 includes a pair of p-channel transistors 302, 304 (e.g., pMOS) and a pair of n-channel transistors 306, 308 (e.g., nMOS).

P-channel transistors 302, 304 are coupled in parallel between the voltage source $V_{DD}$ and the output terminal (OUT). N-channel transistors 306, 308 are coupled in series between the output terminal (OUT) and reference ground. P-channel transistors 302, 304 are body biased using the bias voltage source $V_{BB}$ coupled to the body of the p-channel transistors 302, 304.

In embodiments, the first input of the logic NAND gate 300 is coupled to the gate terminals of p-channel transistor 302 and n-channel transistor 306. In embodiments, the second input of the logic NAND gate 300 is coupled to the gate terminals of p-channel transistor 304 and n-channel transistor 308.

Table II illustrates the truth table for the two-input logic NAND gate 300 and corresponding current leakages in the different modes of operation.

TABLE II

| INPUT (A) | INPUT (B) | OUTPUT | $I_{static}$ | $I_{static}$ (significant contribution) |
|---|---|---|---|---|
| 0 | 0 | 1 | $2 \times I_{gate\_pMOS} + I_{off\_nMOS}$ | $I_{off\_nMOS}$ |
| 0 | 1 | 1 | $I_{gate\_pMOS} + I_{gate\_MOS} + I_{off\_nMOS}$ | $I_{off\_nMOS}$ |
| 1 | 0 | 1 | $I_{gate\_pMOS} + I_{off\_nMOS}$ | $I_{off\_nMOS}$ |
| 1 | 1 | 0 | $2 \times I_{gate\_nMOS} + 2 \times 2 \times I_{off\_pMOS}$ | $I_{off\_pMOS}$ |

When n-channel transistors 306, 308 are OFF, and p-channel transistors 302, 304 are ON, the output logic (OUT) is a logic high (i.e., "1"). This condition occurs when each input A and B is a logic low (i.e., "0")—first row of Table II. The current leakage corresponding to this mode equals the gate current leakage ($I_{gate\_pMOS}$) from each of the p-channel transistors 302, 304 and the subthreshold leakage current ($I_{off\_MOS}$) contribution from the n-channel transistor 308 in the OFF condition (i.e., no gate current leakage ($I_{gate\_nMos}$) from the n-channel transistors 306, 308), or $2 \times I_{gate\_pMos} + I_{off\_nMOS}$. As the n-channel transistors 306, 308 are not body biased, the subthreshold leakage current ($I_{off\_nMOS}$) contribution from the n-channel transistor 306, 308 in the OFF condition is greater than the subthreshold leakage current ($I_{off\_pMOS}$) contribution from the p-channel transistor 302, 304 in the OFF condition.

When one of the inputs is a logic high (i.e., "1"), and the other one of the inputs is a logic low (i.e., "0"), either (i) n-channel transistor 306 is OFF and p-channel transistor 302 is ON, or (ii) n-channel transistor 308 is OFF and p-channel transistor 304 is ON, the output logic (OUT) is a logic high (i.e., "1")—second and third rows of Table II, respectively.

The current leakage corresponding to the first condition (i.e., n-channel transistor 306 is OFF and p-channel transistor 302 is ON) equals the gate current leakage ($I_{gate\_}$nMOS) of the n-channel transistor 308, gate current leakage ($I_{gate\_}$pMOS) of the p-channel transistor 302, and subthreshold leakage current ($I_{off\_}$nMOS) contribution from the n-channel transistor 306 in the OFF condition, or $I_{gate\_pMOS} + I_{gate\_nMos} + I_{off\_nMOS}$.

The current leakage corresponding to the second condition (i.e., n-channel transistor 308 is OFF and p-channel transistor 304 is ON) equals the gate current leakage ($I_{gate\_pMOS}$) of the p-channel transistor 304 and the subthreshold leakage current ($I_{off\_nMOS}$) contribution from the n-channel transistor 308 in the OFF condition (i.e., no gate current leakage ($I_{gate\_nMOS}$) from the n-channel transistors 306, 308), or $I_{gate\_pMOS} + I_{off\_nMOS}$.

When n-channel transistors 306, 308 are "ON," and p-channel transistors 302, 304 are "OFF," the output logic (OUT) is a logic low (i.e., "0"). This condition occurs when each input A and B is a logic high (i.e., "1")—the lowest row of Table II. The current leakage corresponding to this mode equals the gate current leakage ($I_{gate\_nMOS}$) from each of the n-channel transistors 306, 308 and the subthreshold leakage current ($I_{off\_pMOS}$) contribution from the p-channel transistors 302, 304 in the OFF condition. Thus, the total current leakage in this mode can be represented as $2 \times I_{gate\_nMOS} + 2 \times I_{off\_pMOS}$.

The fourth column in Table II summarizes the current leakage in the logic NAND gate 300 in the different modes. In an integrated circuit manufactured using 65 nm technology or greater, the contribution from the gate current leakage is negligible. The fifth column in Table II summarizes the significant contributions to the current leakage in the Logic NAND gate 300 in the different modes. Embodiments of this disclosure provide an improved cell structure that reduces the subthreshold leakage current contribution from, for example, the n-channel transistors 306, 308.

Figure 4:
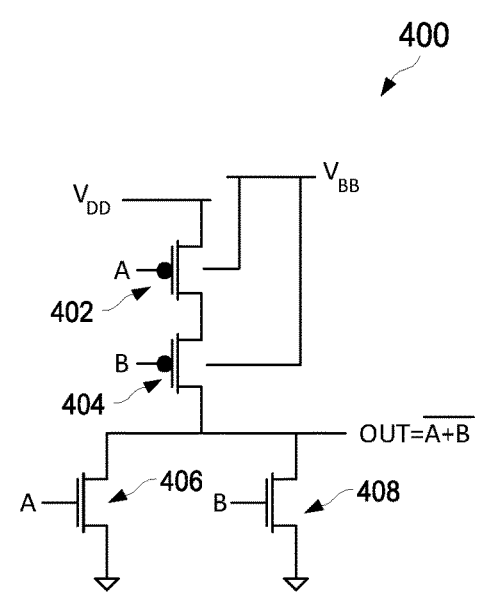
FIG. 4 is a schematic of a conventional CMOS two-input logic NOR (NOT-OR) gate with body biasing applied to the p-channel transistors.

FIG. 4 illustrates a schematic of a conventional CMOS two-input logic NOR (NOT-OR) gate 400 with body biasing applied to the p-channel transistors 402, 404. The output of the Logic NOR gate 400 is logic high (e.g., "1") only when the inputs are a logic low (e.g., "0"). Logic NOR gate 400 includes a pair of p-channel transistors 402, 404 (e.g., pMOS) and a pair of n-channel transistors 406, 408 (e.g., nMOS).

P-channel transistors 402, 404 are coupled in series between the voltage source $V_{DD}$ and the output terminal (OUT). N-channel transistors 406, 408 are coupled in parallel between the output terminal (OUT) and reference ground. P-channel transistors 402, 404 are body biased using the bias voltage source $V_{BB}$ coupled to the body of the p-channel transistors 402, 404.

In embodiments, the first input of the logic NAND gate 300 is coupled to the gate terminals of p-channel transistor 402 and n-channel transistor 406. In embodiments, the second input of the logic NAND gate 300 is coupled to the gate terminals of p-channel transistor 404 and n-channel transistor 408.

Table III illustrates the truth table for the two-input logic NOR gate 400 and corresponding current leakages in the different modes of operation.

TABLE III

| INPUT (A) | INPUT (B) | OUTPUT | $I_{static}$ | $I_{static}$ (significant contribution) |
|---|---|---|---|---|
| 0 | 0 | 1 | $2 \times I_{gate\_pMOS} + 2 \times I_{off\_nMOS}$ | $2 \times I_{off\_nMOS}$ |
| 0 | 1 | 0 | $I_{gate\_pMOS} + I_{gate\_nMOS} + I_{off\_pMOS}$ | $I_{off\_pMOS}$ |
| 1 | 0 | 0 | $I_{gate\_nMOS} + I_{off\_pMOS}$ | $I_{off\_pMOS}$ |
| 1 | 1 | 0 | $2 \times I_{gate\_nMOS} + I_{off\_pMOS}$ | $I_{off\_pMOS}$ |

When n-channel transistors 406, 408 are OFF, and p-channel transistors 402, 404 are ON, the output logic (OUT) is a logic high (i.e., "1"). This condition occurs when each input A and B is a logic low (i.e., "0")—first row of Table III. The current leakage corresponding to this mode equals the gate current leakage ($I_{gate\_pMOS}$) from each of the p-channel transistors 402, 404 and the subthreshold leakage current ($I_{off\_nMOS}$) contribution from each of n-channel transistor 406, 408 in the OFF condition (i.e., no gate current leakage ($I_{gate\_nMOS}$) from the n-channel transistors 406, 408), or $2 \times I_{gate\_pMOS} + 2 \times I_{off\_nMOS}$. As the n-channel transistors 406, 408 are not body biased, the subthreshold leakage current ($I_{off\_nMOS}$) contribution from the n-channel transistor 406, 408 in the OFF condition is greater than the subthreshold leakage current ($I_{off\_pMOS}$) contribution from the p-channel transistor 402, 404 in the OFF condition.

When one of the inputs is a logic high (i.e., "1"), and the other one of the inputs is a logic low (i.e., "0"), either (i) n-channel transistor 406 is OFF and p-channel transistor 402 is ON, or (ii) n-channel transistor 408 is OFF and p-channel transistor 404 is ON, the output logic (OUT) is a logic low (i.e., "0")—second and third rows of Table III, respectively.

The current leakage corresponding to the first condition (i.e., n-channel transistor 406 is OFF and p-channel transistor 402 is ON) equals the gate current leakage ($I_{gate\_nMOS}$) of the n-channel transistor 408, gate current leakage ($I_{gate\_pMOS}$) of the p-channel transistor 402, and the subthreshold leakage current ($I_{off\_pMos}$) contribution from the p-channel transistor 404 in the OFF condition, or $I_{gate\_pMOS} + I_{gate\_nMOS} + I_{off\_pMOS}$.

The current leakage corresponding to the second condition (i.e., n-channel transistor 408 is OFF and p-channel transistor 404 is ON) equals gate current leakage ($I_{gate\_nMOS}$) of the n-channel transistor 406 and the subthreshold leakage current ($I_{off\_pMOS}$) contribution from the p-channel transistor 402 in the OFF condition (i.e., no gate current leakage ($I_{gate\_pMOS}$) from the p-channel transistors 402, 404), or $I_{gate\_nMOS} + I_{off\_pMOS}$.

When n-channel transistors 406, 408 are "ON," and p-channel transistors 402, 404 are "OFF," the output logic (OUT) is a logic low (i.e., "0"). This condition occurs when each input A and B is a logic high (i.e., "1")—the lowest row of Table III. The current leakage corresponding to this mode equals the gate current leakage ($I_{gate\_nMOS}$) from each of the n-channel transistors 406, 408 and the subthreshold leakage current ($I_{off\_pMOS}$) contribution from the p-channel transistor 404 in the OFF condition. Thus, the total current leakage in this mode can be represented as $2 \times I_{gate\_nMOS} + I_{off\_pMOS}$.

The fourth column in Table III summarizes the current leakage in the logic NOR gate 400 in the different modes. In an integrated circuit manufactured using 65 nm technology or greater, the contribution from the gate current leakage is negligible. The fifth column in Table III summarizes the significant contributions to the current leakage in the Logic NOR gate 400 in the different modes. Embodiments of this disclosure provide an improved cell structure that reduces the subthreshold leakage current contribution from, for example, the n-channel transistors 406, 408.

Figure 5:
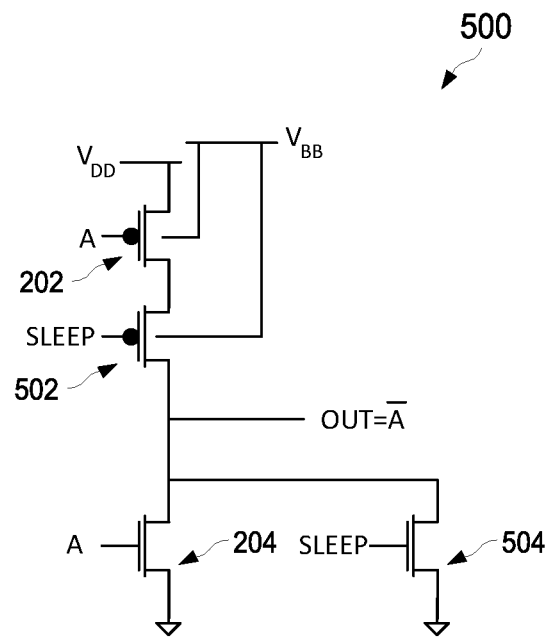
FIG. 5 is a schematic of an embodiment CMOS logic NOT gate.

FIG. 5 illustrates a schematic of an embodiment CMOS logic NOT gate 500. Logic NOT gate 500 includes p-channel transistors 202, 502 (e.g., pMOS) and n-channel transistors 204, 504 (e.g., nMOS). Logic NOT gate 500 may include additional components not shown. For example, logic NOT gate 500 may include resistors at one or more terminals of the various transistors. Logic NOT gate 500 may be coupled to other logic gates to produce other logic gate functions. Logic NOT gate 500 is similar to logic NOT gate 200; however, logic NOT gate 500 includes an additional series p-channel transistor 502 with respect to the pMOS cloud (i.e., p-channel transistor 202) and a shunt n-channel transistor 504 with respect to the nMOS cloud (i.e., n-channel transistor 204). In embodiments, CMOS logic NOT gate 500 includes two input pins: one data input pin and one sleep input pin.

P-channel transistors 202, 502 are coupled in series between the voltage source $V_{DD}$ and the output terminal (OUT). N-channel transistors 204, 504 are coupled in parallel between the output terminal (OUT) and reference ground. The drain terminals of the p-channel transistors 202, 502 and the n-channel transistors 204, 504 are coupled to the output terminal (OUT). P-channel transistors 202, 502 are body biased using the bias voltage source $V_{BB}$ coupled to the body of the p-channel transistors 202, 502.

In embodiments, the input of the logic NOT gate 500 is coupled to the gate terminals of p-channel transistor 202 and the gate terminal of n-channel transistor 204. In embodiments, the sleep input is coupled to the gate terminals of series p-channel transistor 502 and shunt n-channel transistor 504.

Table IV illustrates the truth table for the logic NOT gate 500 and corresponding current leakages in the different modes of operation.

TABLE IV

| INPUT (A) | INPUT (SLEEP) | OUTPUT | DESIRED OUT | $I_{static}$ (significant contribution) |
|---|---|---|---|---|
| 0 | 1 | X | 1 | $I_{off\_pMOS}$ |
| 1 | 0 | 0 | 0 | $I_{off\_pMOS}$ |

The truth table for the logic NOT gate 500 follows the truth table for the single-input logic NOT gate 200 in one mode of operation when the sleep input is set to logic low (e.g., "0"). As previously discussed, the significant contributing factor to the current leakage of the logic NOT gate 200 in this mode of operation is the subthreshold current leakage ($I_{off\_pMOS}$) contribution from the p-channel transistor 202 in the OFF condition. In logic NOT gate 500, the significant contributing factor to the current leakage in this mode of operation is the subthreshold leakage current ($I_{off\_pMOS}$) contribution from the p-channel transistor 502. As the series p-channel transistor 502 is a p-channel type, it can use the body biasing technique to reduce current leakage without significantly impacting the integrated circuit's power consumption. It is noted that functionally, logic NOT gate 500 operates similarly to logic NOT gate 200 in response to the sleep input being set to logic low.

In the second mode of operation, when the sleep input is set to logic high (e.g., "1")—corresponding to the first row of Table IV—the output of logic NOT gate 500 differs from logic NOT gate 200. As previously discussed, the significant contributing factor to the current leakage of logic NOT gate 200, when the data input (i.e., A) is set to logic low, is the overall subthreshold leakage current ($I_{off\_nMOS}$) from the n-channel transistor 204 (i.e., $I_{off\_nMos}$), as it is in the OFF condition. In logic NOT gate 500, however, when the data input is set to logic low and the sleep input is set to logic high, the gate terminals of the series p-channel transistor 502 and shunt n-channel transistor 504 are set to logic high (e.g., "1"), which results in the series p-channel transistor 502 turning OFF and shunt n-channel transistor 504 turning ON.

The turning ON of shunt n-channel transistor 504, pulls the output of logic NOT gate 500 to a logic low (e.g., "0"), which is considered incorrect or corrupt (denoted in Table IV as "X"). Advantageously, however, the significant contributing factor to the current leakage in this mode of operation becomes the subthreshold leakage current ($I_{off\_p}$-MOS) contribution from the p-channel transistors 202, 502, which are in the OFF condition (i.e., $2 \times I_{off\_pMos}$). As the p-channel transistors 202, 502 take advantage of the body biasing technique, the subthreshold leakage current in this mode of operation is minimized (with respect to the same mode in logic NOR gate 200) without significantly impacting power consumption.

Figure 6:
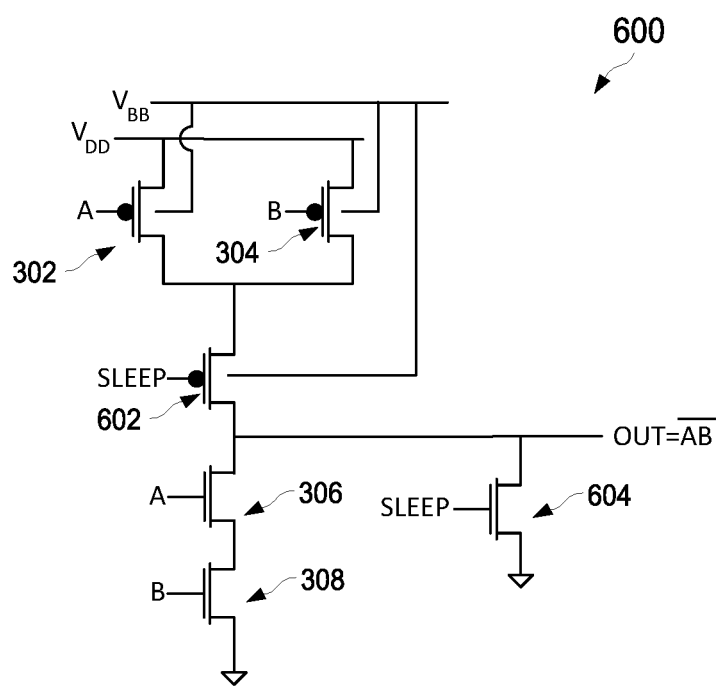
FIG. 6 is a schematic of an embodiment CMOS logic NAND gate.

FIG. 6 illustrates a schematic of an embodiment CMOS logic NAND gate 600. Logic NAND gate 600 includes three p-channel transistors 302, 304, 602 (e.g., pMOS) and three n-channel transistors 306, 308, 604 (e.g., nMOS). Logic NAND gate 600 may include additional components not shown. For example, Logic NAND gate 600 may include resistors at one or more terminals of the various transistors. Logic NAND gate 600 may be coupled to other logic gates to produce other types of logic gate functions. Logic NAND gate 600 is similar to the logic NAND gate 300; however, logic NAND gate 600 includes an additional series p-channel transistor 602 with respect to the pMOS cloud (i.e., p-channel transistors 302, 304) and a shunt n-channel transistor 604 with respect to the nMOS cloud (i.e., n-channel transistors 306, 308). In embodiments, CMOS logic NAND gate 600 includes three input pins: two data input pins and one sleep input pin.

P-channel transistors 302, 304 are coupled in parallel between the voltage source $V_{DD}$ and series p-channel transistor 702. N-channel transistors 306, 308 are coupled in series between the output terminal and reference ground. Shunt n-channel transistor 604 is coupled between the output terminal and reference ground. P-channel transistors 302, 304, 602 are body biased using the bias voltage source $V_{BB}$ coupled to the body of the p-channel transistors 302, 304, 602. The drain terminals of the series p-channel transistor 602 and shunt n-channel transistor 604 and n-channel transistor 306 are coupled to the output terminal (OUT).

In embodiments, the first input of the logic NAND gate 600 is coupled to the gate terminals of p-channel transistor 302 and n-channel transistor 306. In embodiments, the second input of the logic NAND gate 600 is coupled to the gate terminals of p-channel transistor 304 and n-channel transistor 308. In embodiments, the sleep input is coupled to the gate terminals of series p-channel transistor 602 and shunt n-channel transistor 604.

Table V illustrates the truth table for the logic NAND gate 600 and corresponding current leakages in the different modes of operation.

TABLE V

| INPUT (A) | INPUT (B) | INPUT (SLEEP) | OUTPUT | DESIRED OUT | $I_{static}$ (significant contribution) |
|---|---|---|---|---|---|
| 0 | 0 | 1 | X | 1 | $2 \times I_{off\_pMOS}$ |
| 0 | 1 | 1 | X | 1 | $2 \times I_{off\_pMOS}$ |
| 1 | 0 | 1 | X | 1 | $2 \times I_{off\_pMOS}$ |
| 1 | 1 | 0 | 0 | 0 | $3 \times I_{off\_pMOS}$ |

The truth table for the logic NAND gate 600 follows the truth table for the two-input logic NAND gate 300 in one mode of operation when the sleep input is set to logic low (e.g., "0"). As previously discussed, the corresponding significant contributing factor to the current leakage of the logic NAND gate 300 is the subthreshold current leakage ($I_{off\_pMOS}$) contribution from the p-channel transistors 302, 304 when they are in the OFF condition. In logic NAND gate 600, the significant contributing factor to the corresponding current leakage is the subthreshold current leakage ($I_{off\_pMOS}$) contribution from the p-channel transistors 302, 304, 602.

As the p-channel transistors 302, 304, 602 are p-channel type, they can take advantage of the body biasing technique to reduce subthreshold leakage current without significantly impacting the integrated circuit's power consumption. It is noted that functionally, logic NAND gate 600 operates similarly to logic NAND gate 300 in response to the sleep input being set to logic low.

In the other three modes of operation, when the sleep input is set to logic high (e.g., "1")—corresponding to the first three rows of Table V—the output of logic NAND gate 600 differs from logic NAND gate 300. As previously discussed, the corresponding significant contributing factor to the current leakage of logic NAND gate 300 is the subthreshold leakage current ($I_{off\_nMos}$) from the n-channel transistor 306 or the n-channel transistor 308 (i.e., $I_{off\_nMos}$), when they are in the OFF condition. In logic NAND gate 600, however, when the sleep input is set to logic high, the gate terminals of the series p-channel transistor 602 and shunt n-channel transistor 604 are set to logic high (e.g., "1"), which results in the p-channel transistor 602 turning OFF and shunt n-channel transistor 604 turning ON.

The turning ON of shunt n-channel transistor 604, pulls the output of logic NAND gate 600 to a logic low (e.g., "0"), which is considered incorrect or corrupt (denoted in Table V as "X"). Advantageously, however, the significant contributing factor to the current leakage in these modes of operation becomes the subthreshold leakage current ($I_{off\_pMOS}$) contribution from the p-channel transistors 302, 702 or p-channel transistors 304, 602, which are in the OFF condition (i.e., $2 \times I_{off\_pMos}$). As the p-channel transistors 302, 304, and 602 take advantage of the body biasing technique, the subthreshold leakage current in this mode of operation is minimized (with respect to the same mode in logic NAND gate 300) without significantly impacting power consumption.

Figure 7:
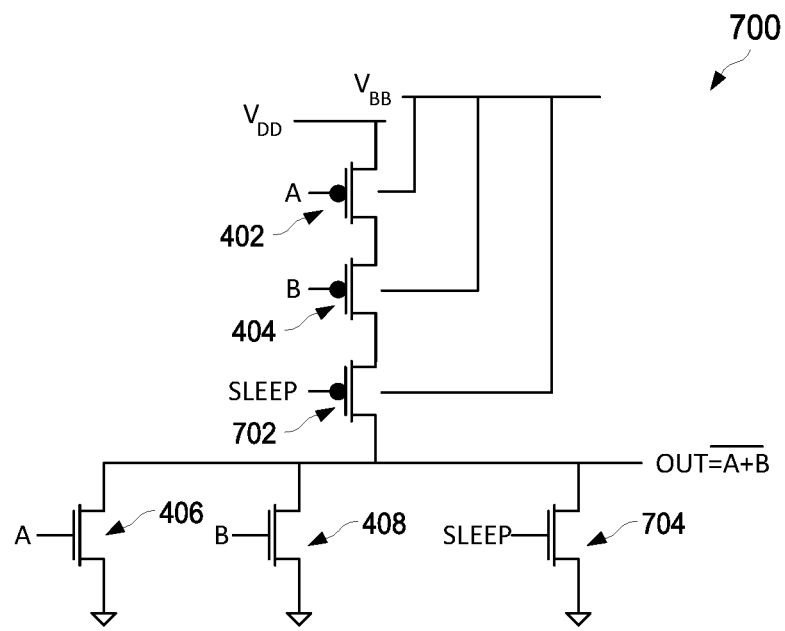
FIG. 7 is a schematic of an embodiment CMOS logic NOR gate.

FIG. 7 illustrates a schematic of an embodiment CMOS logic NOR gate 700. Logic NOR gate 700 includes three p-channel transistors 402, 404, 702 (e.g., pMOS) and three n-channel transistors 406, 408, 704 (e.g., nMOS). Logic NOR gate 700 may include additional components not shown. For example, Logic NOR gate 700 may include resistors at one or more terminals of the various transistors. Logic NOR gate 700 may be coupled to other logic gates to produce other types of logic gate functions. Logic NOR gate 700 is similar to the logic NOR gate 400; however, logic NOR gate 700 includes an additional series p-channel transistor 702 with respect to the pMOS cloud (i.e., p-channel transistors 402, 404) and a shunt n-channel transistor 704 with respect to the nMOS cloud (i.e., n-channel transistors 406, 408). In embodiments, CMOS logic NOR gate 700 includes three input pins: two data input pins and one sleep input pin.

P-channel transistors 402, 404, 702 are coupled in series between the voltage source $V_{DD}$ and the output terminal (OUT). N-channel transistors 406, 408, 704 are coupled in parallel between the output terminal (OUT) and reference ground. P-channel transistors 402, 404, 702 are body biased using the bias voltage source $V_{BB}$ coupled to the body of p-channel transistors 402, 404, 702. The drain terminals of the n-channel transistors 406, 408, 704 and the series p-channel transistor 702 are coupled to the output terminal (OUT). P-channel transistor 404 is coupled in series between the p-channel transistor 402 and the series p-channel transistor 702. p-channel transistor 402 is coupled in series between the p-channel transistor 404 and the voltage source $V_{DD}$.

In embodiments, the first input of the logic NOR gate 700 is coupled to the gate terminals of p-channel transistor 402 and n-channel transistor 406. In embodiments, the second input of the logic NOR gate 700 is coupled to the gate terminals of p-channel transistor 404 and n-channel transistor 408. In embodiments, the sleep input is coupled to the gate terminals of the series p-channel transistor 702 and shunt n-channel transistor 704.

Table VI illustrates the truth table for the logic NOR gate 700 and corresponding current leakages in the different modes of operation.

TABLE VI

| INPUT (A) | INPUT (B) | INPUT (SLEEP) | OUTPUT | DESIRED OUT | $I_{static}$ (significant contribution) |
|---|---|---|---|---|---|
| 0 | 0 | 1 | X | 1 | $3 \times I_{off\_PMOS}$ |
| 0 | 1 | 0 | 0 | 0 | $I_{off\_pMOS}$ |
| 1 | 0 | 0 | 0 | 0 | $I_{off\_pMOS}$ |
| 1 | 1 | 0 | 0 | 0 | $I_{off\_pMOS}$ |

The truth table for the logic NOR gate 700 follows the truth table for the two-input logic NOR gate 400 in three modes of operation when the sleep input is set to logic low (e.g., "0"). As previously discussed, the corresponding significant contributing factor to the current leakage of the logic NOR gate 400 is the subthreshold leakage current ($I_{off\_pMOS}$) contribution from the p-channel transistor 402 or the p-channel transistor 404 when they are in the OFF condition. In logic NOR gate 700, the corresponding significant contributing factor to the current leakage is the subthreshold leakage current ($I_{off\_pMOS}$) contribution from the p-channel transistor 702—the p-channel transistors 402, 404 have a smaller drain to source voltage (VDS). As the series p-channel transistor 702 is a p-channel type, similar to the p-channel transistors 402, 404 in logic NOR gate 400, it can use the body biasing technique to reduce current leakage without significantly impacting the integrated circuit's power consumption. It is noted that functionally, logic NOR gate 700 operates similarly to logic NOR gate 400 in response to the sleep input being set to logic low.

In one mode of operation, when the sleep input is set to logic high (e.g., "1")—corresponding to the first row of Table VI—the output of logic NOR gate 700 differs from logic NOR gate 400. As previously discussed, the corresponding significant contributing factor to the current leakage of logic NOR gate 400 is the overall subthreshold leakage current ($I_{off\_nMOS}$) from the n-channel transistors 406, 408 (i.e., $2 \times I_{off\_nMos}$), as they are in the OFF condition. In logic NOR gate 700, however, when the sleep input is set to logic high, the gate terminals of the series p-channel transistor 702 and shunt n-channel transistor 704 are set to logic high (e.g., "1"), which results in the p-channel transistor 702 turning OFF and shunt n-channel transistor 704 turning ON.

The turning ON of shunt n-channel transistor 704, pulls the output of logic NOR gate 700 to a logic low (e.g., "0"), which is considered incorrect or corrupt (denoted in Table VI as "X"). Advantageously, however, the significant contributing factor to the current leakage in this mode of operation becomes the subthreshold leakage current ($I_{off\_pMOS}$) contribution from the p-channel transistors 402, 404, and 702, which are in the OFF condition (i.e., $3 \times I_{off\_pMos}$). As the p-channel transistors 402, 404, and 702 take advantage of the body biasing technique, the current leakage in this mode of operation is minimized (with respect to the same mode in logic NOR gate 400) without significantly impacting power consumption.

Figure 8:
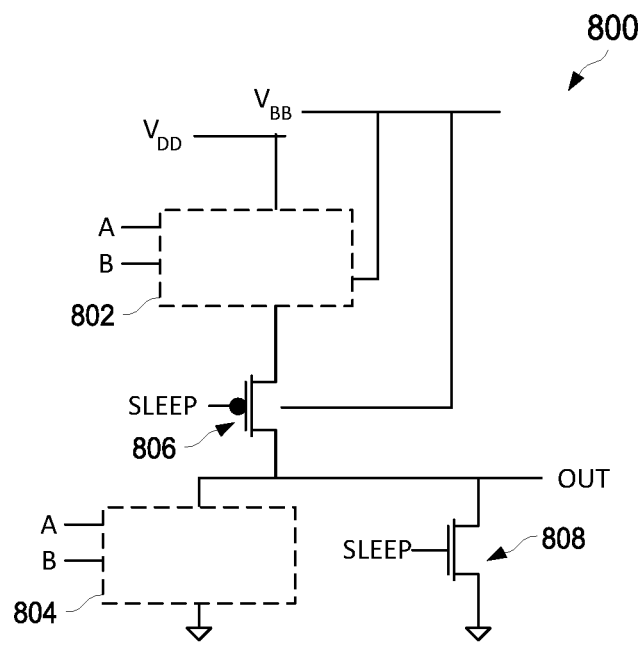
FIG. 8 is a schematic of an embodiment generic CMOS logic gate having a pMOS cloud sub-circuit coupled with a series p-channel transistor and an nMOS cloud sub-circuit coupled with a shunt n-channel transistor.

FIG. 8 illustrates a schematic of an embodiment generic CMOS logic gate 800 having a pMOS cloud sub-circuit 802 coupled with a series p-channel transistor 806 and an nMOS cloud sub-circuit 804 coupled with a shunt n-channel transistor 808, which may (or may not) be arranged as shown. CMOS logic gate 800 may include additional components, such as one or more resistors at one or more terminals of the CMOS logic gate 800. The gate terminals of the series p-channel transistor 806 and shunt n-channel transistor 808 are coupled to the sleep input of the CMOS logic gate 800. In embodiments, the sleep input of the CMOS logic gate 800 is configured to receive a sleep signal from, for example, a processor or a controller. In embodiments, the gate terminals of the series p-channel transistor 806 and shunt n-channel transistor 808 are configured to only receive the sleep signal.

CMOS logic gate 800 is a generic representation of a CMOS logic gate, where the pMOS cloud sub-circuit 802 represents the portion of the logic gate that includes one or more p-channel transistors and nMOS cloud sub-circuit 804 represents the portion of the logic gate that includes one or more n-channel transistors.

For example, p-channel transistor 202 and n-channel transistor 204 in logic NOT gate 200 are represented, respectively, by pMOS cloud sub-circuit 802 and nMOS cloud sub-circuit 804 in logic gate 800. As another example, p-channel transistors 302, 304—arranged in parallel between voltage source $V_{DD}$ and the output terminal—and n-channel transistors 306, 306—arranged in series between the output terminal and reference ground in logic NAND gate 300 are represented, respectively, by pMOS cloud sub-circuit 802 and nMOS cloud sub-circuit 804 in logic gate 800. As yet another example, p-channel transistors 402, 404—arranged in series between voltage source $V_{DD}$ and the output terminal—and n-channel transistors 406, 406—arranged in parallel between the output terminal and reference ground in logic NOR gate 400 are represented, respectively, by pMOS cloud sub-circuit 802 and nMOS cloud sub-circuit 804 in logic gate 800.

It should be appreciated that the series p-channel transistor 806 in CMOS logic gate 800 may represent the series p-channel transistor 502 in logic NOT gate 500, the series p-channel transistor 602 in logic NAND gate 600, or the series p-channel transistor 702 in logic NOR gate 700. It should be appreciated that the shunt n-channel transistor 808 in CMOS logic gate 800 may represent the shunt n-channel transistor 504 in logic NOT gate 500, the shunt n-channel transistor 604 in logic NAND gate 600, or the shunt n-channel transistor 704 in logic NOR gate 700.

CMOS logic gate 800 is arranged such that when the sleep signal is set to logic low, the CMOS logic gate 800 functionally operates as if the series p-channel transistor 806 (ON) and shunt n-channel transistor 808 (OFF) are not part of CMOS logic gate 800. CMOS logic gate 800 is configured such that when the sleep signal is set to logic low, the only leakage current contribution is from the subthreshold current leakage from the pMOS cloud sub-circuit 802.

Further, CMOS logic gate 800 is arranged such that when the sleep signal is to logic high, (i) the shunt n-channel transistor 808 (ON) drives the output of the CMOS logic gate 800 to logic low (i.e., "0") and (ii) the series p-channel transistor 806 (OFF) effectively blocks the electrical path from the voltage source $V_{DD}$ to the output terminal.

CMOS logic gate 800, advantageously uses the sleep signal to remove the subthreshold leakage current contributions from n-channel transistor(s) of the nMOS cloud sub-circuit 804 when the n-channel transistor(s) is in the OFF condition (i.e., setting the sleep signal to logic high). Thus, by selectively enabling the sleep signal in CMOS logic gate 800, the current leakage in CMOS logic gate 800 can be limited to only the subthreshold leakage current ($I_{off\_pMOS}$) contributions from the p-channel transistor(s) in every operating mode of CMOS logic gate 800.

In embodiments, pMOS cloud sub-circuit 802 includes one or more p-channel transistors arranged in series, parallel, or a combinational arrangement. In embodiments, each p-channel transistor of the pMOS cloud sub-circuit 802 and the series p-channel transistor 806 are body biased using the bias voltage source $V_{BB}$ coupled to the body of the series p-channel transistor 806. In embodiments, nMOS cloud sub-circuit 804 includes one or more n-channel transistors arranged in series, parallel, or a combinational arrangement.

Figure 9:
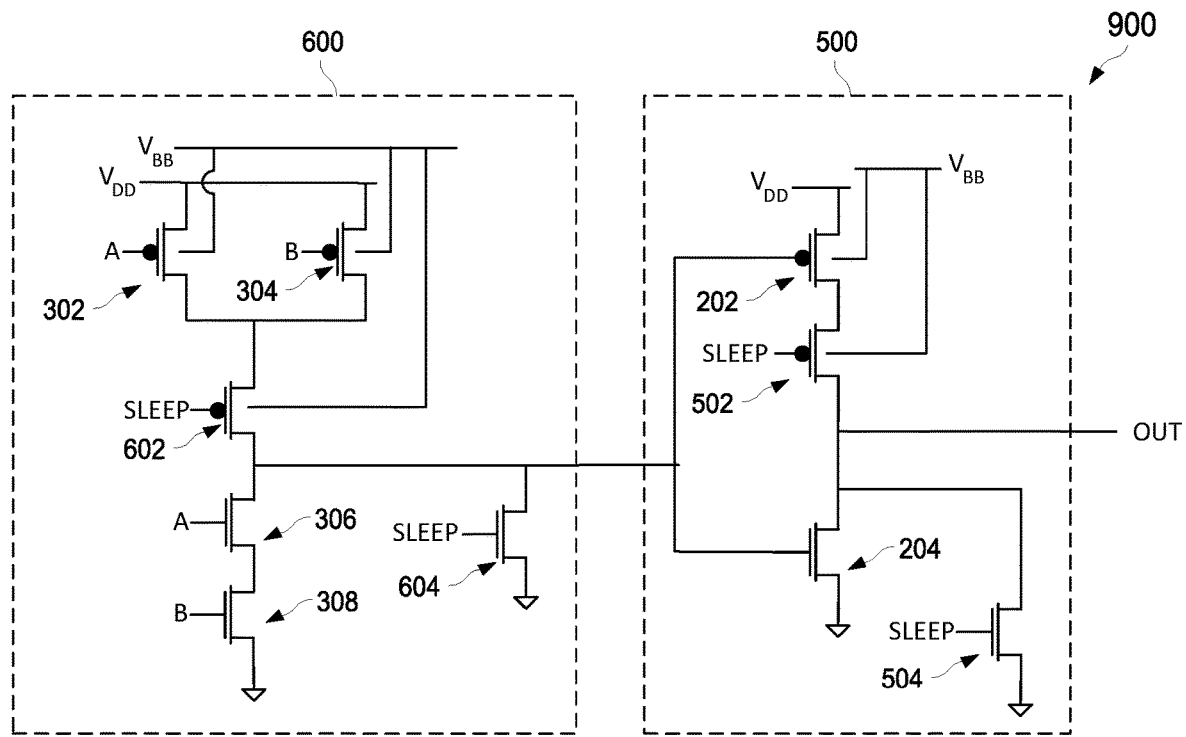
FIG. 9 is a schematic of an embodiment CMOS logic AND gate.

FIG. 9 illustrates a schematic of an embodiment CMOS logic AND gate 900, which includes logic NOT gate 500 coupled to the output of the logic NAND gate 600, which may (or may not) be arranged as shown. Logic AND gate 900 may include additional components not shown. The logic AND gate 900 can be represented as the inverted output (using the logic NOT gate 500) of the logic NAND gate 600. The output of logic NOT gate 500 is the output of the logic AND gate 900. The input to the logic NAND gate 600 is the input of the logic AND gate 900.

Not shown, logic AND gate 900 can be represented as three logic NOR gates 700 where the first input to the third logic NOR gate is coupled to the output of the first logic NOR gate, the second input to the third logic NOR gate is coupled to the output of the second logic NOR gate, the inputs of the first logic NOR gate are coupled to each other and is the first input of the logic AND gate, the inputs of the second NOR gate are coupled to each other and is the second input of the logic AND gate, and the output of the third logic NOR gate is the output of the logic AND gate.

Table VII illustrates the truth table for the two-input logic AND gate 900 and corresponding current leakages in response to the sleep signal at the gate inputs of the series p-channel transistors 502, 602 and shunt n-channel transistors 504, 604 being asserted (e.g., logic level high).

TABLE VII

| INPUT (A) | INPUT (B) | INPUT (SLEEP) | OUTPUT | $I_{static}$ (significant contribution) |
|---|---|---|---|---|
| 0 | 0 | 1 | 0 | 4 × $I_{off\_pMOS}$ |
| 0 | 1 | 1 | 0 | 4 × $I_{off\_pMOS}$ |
| 1 | 0 | 1 | 0 | 4 × $I_{off\_pMOS}$ |
| 1 | 1 | 1 | 0 | 4 × $I_{off\_pMOS}$ |

As shown, when the sleep signal is asserted, the output of the logic AND gate 900 is a logic low (i.e., "0"), regardless of the logic level of the data inputs (A, B). Although a logic low is a wrong output for the last row of the truth table (i.e., logic high for both inputs should be a logic high output), the output of the logic AND gate 900 in sleep mode is irrelevant, as further discussed below (e.g., the output of the multiplexer 1104 is set to a desired output value during sleep mode). Advantageously, during sleep mode, there is no subthreshold leakage current contribution from an n-channel transistor of the logic AND gate 900, and the only contribution is from the subthreshold leakage currents from the p-channel transistors, which are body biased.

In embodiments, in response to the sleep signal being de-asserted (e.g., logic low at the gate inputs of the series p-channel transistors 502, 602 and shunt n-channel transistors 504, 604), the CMOS logic AND gate 900 operates similar to the conventional AND gate.

Figure 10:
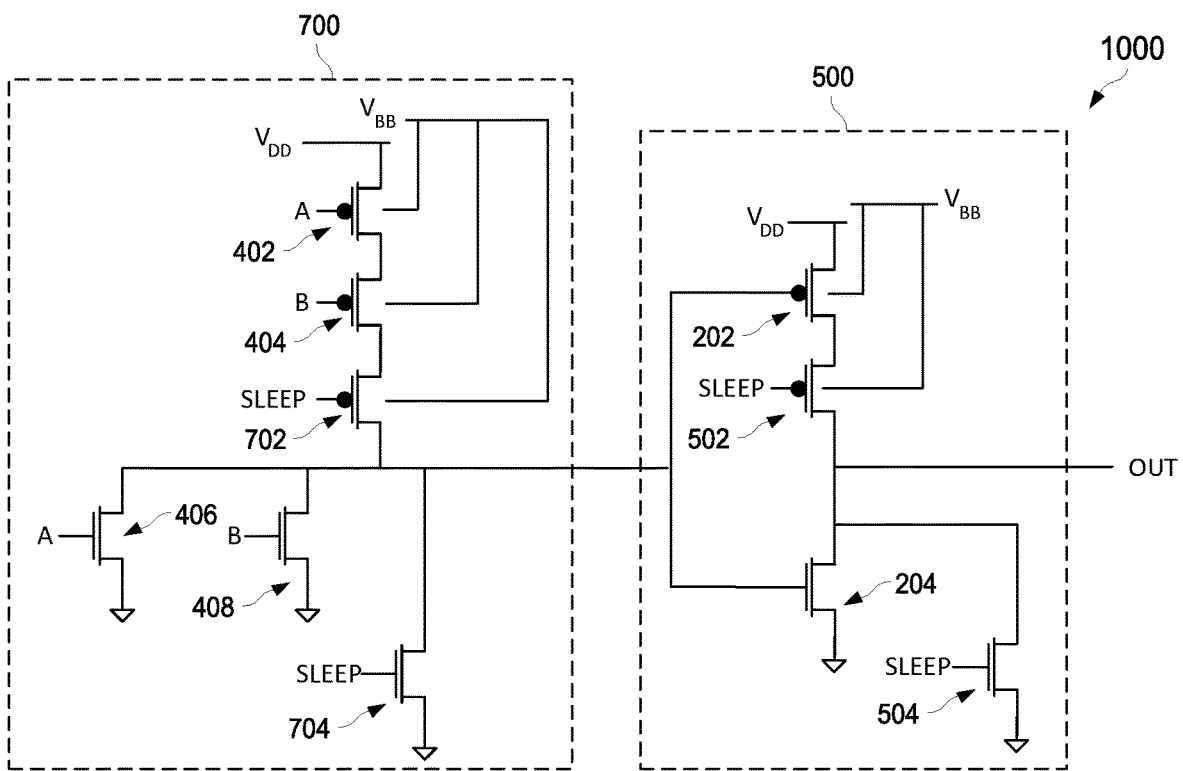
FIG. 10 is a schematic of an embodiment CMOS logic OR gate.

FIG. 10 illustrates a schematic of an embodiment CMOS logic OR gate 1000, which includes logic NOT gate 500 coupled to the output of the logic NOR gate 700, which may (or may not) be arranged as shown. Logic OR gate 1000 may include additional components not shown. The logic OR gate 1000 can be represented as the inverted output (using the logic NOT gate 500) of the logic NOR gate 700. The output of logic NOT gate 500 is the output of the logic OR gate 1000. The input to the logic NOR gate 700 is the input of the logic OR gate 1000.

Table VIII illustrates the truth table for the two-input logic OR gate 1000 and corresponding current leakages in response to the sleep signal at the gate inputs of the series p-channel transistors 502, 702 and shunt n-channel transistors 504, 704 being asserted (e.g., logic level high).

TABLE VIII

| INPUT (A) | INPUT (B) | INPUT (SLEEP) | OUTPUT | $I_{static}$ (significant contribution) |
|---|---|---|---|---|
| 0 | 0 | 1 | 0 | $3 \times I_{off\_pMOS}$ |
| 0 | 1 | 1 | 0 | $3 \times I_{off\_pMOS}$ |
| 1 | 0 | 1 | 0 | $3 \times I_{off\_pMOS}$ |
| 1 | 1 | 1 | 0 | $3 \times I_{off\_pMOS}$ |

As shown, when the sleep signal is asserted, the output of the logic OR gate 1000 is a logic low (i.e., "0"), regardless of the logic level of the data inputs (A, B). Although a logic low is a wrong output for the first row of the truth table (i.e., logic low for both inputs should be a logic high output), the output of the logic OR gate 1000 in sleep mode is irrelevant, as further discussed below (e.g., the output of the multiplexer 1104 is set to a desired output value during sleep mode). Advantageously, during sleep mode, there is no subthreshold leakage current contribution from an n-channel transistor of the logic OR gate 1000, and the only contribution is from the subthreshold leakage currents from the p-channel transistors, which are body biased.

In embodiments, in response to the sleep signal being de-asserted (e.g., logic low at the gate inputs of the series p-channel transistors 502, 702 and shunt n-channel transistors 504, 704), the CMOS logic OR gate 1000 operates similar to the conventional OR gate.

Figure 11:
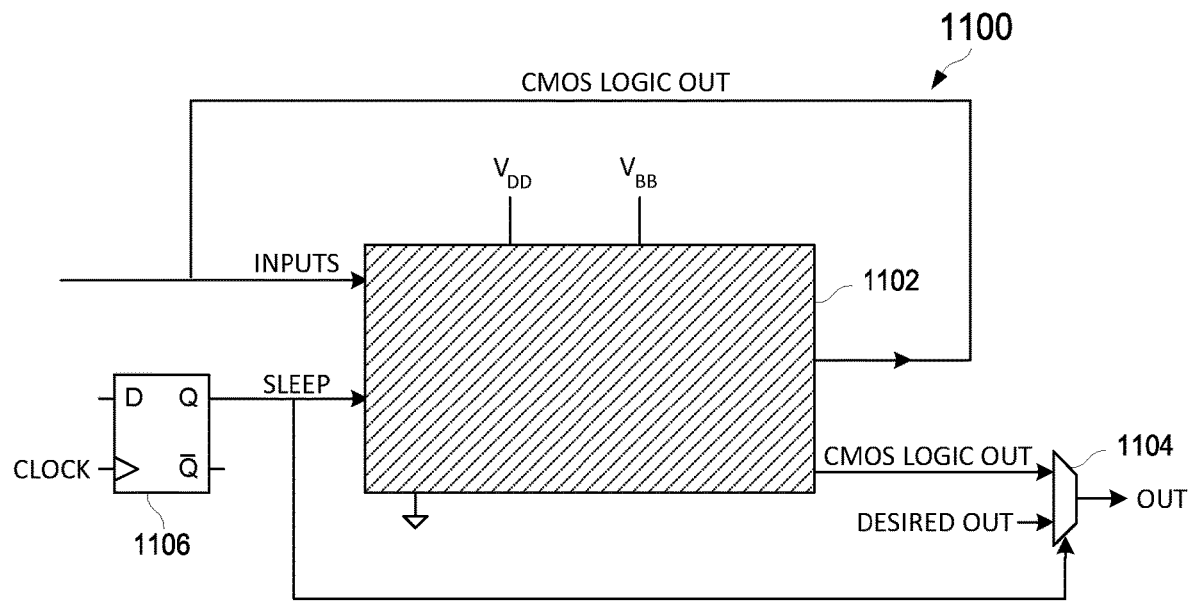
FIG. 11 is a schematic of an embodiment integrated circuit.

FIG. 11 illustrates a schematic of an embodiment integrated circuit 1100. The integrated circuit 1100 includes one or more logic gates 1102, a multiplexer 1104, and a flip-flop 1106, which may (or may not) be arranged as shown. The integrated circuit 1100 may include additional components not shown, such as a memory or a processor. In embodiments, the logic gates 1102 includes one or more of the logic NAND gate 600, logic NOR gate 700, logic NOT gate 500, or a combination thereof. In embodiments, the logic gates 1102 includes one or more of the CMOS logic gate 800.

The output of the flip-flop 1106 is coupled to the sleep input terminal of one or more logic gates 1102 and the select terminal of the multiplexer 1104. In embodiments, the output of the logic gates 1102 is coupled to the first input of the multiplexer 1104. In embodiments, the second input terminal of the multiplexer 1104 is coupled to a controller. The controller may be internal or external to the integrated circuit. In embodiments, the controller may be a component of a device that includes the integrated circuit 1100. The controller is configured to provide a desired output value to the second input of the multiplexer 1104.

The multiplexer is configured to set an output signal at the output terminal of the multiplexer 1104 to a signal at the first input terminal (i.e., coupled to the output of the logic gates 1102) in response to the sleep signal being de-asserted (i.e., sleep signal set to a logic low). Further, the multiplexer 1104 is configured to set the output signal at the output terminal of the multiplexer to a signal at the second input terminal (i.e., coupled to the controller) of the multiplexer 1104 in response to the sleep signal being asserted (i.e., sleep signal set to a logic high). In embodiments, the output of the multiplexer 1104 is the output terminal of the integrated circuit 1100.

The flip-flop 1106 provides a logic high signal to the inputs of each logic gate of the logic gates 1102 and the select terminal of the multiplexer 1104 to enter sleep mode. During sleep mode, the only leakage current contributions from the logic gates 1102 are the subthreshold leakage currents of the OFF p-channel transistors of the logic gates 1102, which are body biased. Thus, in sleep mode, advantageously, there are no subthreshold leakage current contributions from the OFF n-channel transistors of the logic gates 1102, which are not body biased. Further, as the sleep mode is only entered when there is no contribution from the subthreshold current leakage of the OFF n-channel transistors of the logic gates 1102, in either sleep mode or non-sleep mode, there is no subthreshold current leakage contribution from the OFF n-channel transistors of the logic gates 1102.

In sleep mode, a-priori the desired output to be provided at the second input terminal of the multiplexer 1104 is known, for example, based on the design specification requirements of the integrated circuit. In embodiments, the desired output value is either hardwired to reference ground (i.e., logic level low) or voltage source $V_{DD}$ (i.e., logic level high). In sleep mode, corresponding to the sleep signal being asserted (e.g., logic level high), the desired output value is provided at the output of the multiplexer 1104. In embodiments, a controller coupled to the second input terminal of the multiplexer 1104 provides a desired output for the integrated circuit and allows a bypass mode for the logic gates 1102—bypassing the corrupted output logic of the logic gates 1102 during sleep mode.

In embodiments, the sleep signal is asserted (e.g., set to logic level high) in response to the integrated circuit 1100 (e.g., module) or device having the integrated circuit 1100 being placed in sleep mode. A device with integrated circuit 1100 may include a sleep mode operation corresponding to a low power mode. During the low power mode, the power used by the device is reduced by disabling one or more features typically available during full power mode. For example, a mobile device may disable certain features in low power mode to preserve battery power in response to reaching a threshold battery percentage. In embodiments, the integrated circuit 1100 may no longer receive a clock signal in sleep mode. In embodiments, the integrated circuit 1100 may be powered down in sleep mode. In embodiments, the sleep signal is asserted in response to the device or integrated circuit 1100 being in sleep mode to reduce the leakage current and preserve power stored, for example, in a battery of the device. In embodiments, the sleep mode is enabled by the controller (e.g., processor 1202), which results in the sleep signal being asserted. In embodiments, the controller enables the sleep mode based on the desired operating state of the integrated circuit 1100 or device 1200.

As an exemplary embodiment, after the controller completes a routine, there may be a delay of 10 milliseconds (ms) until new input data is received or collected. The controller can enable sleep mode and assert the sleep signal to minimize the power consumption (i.e., leakage current) by the logic gates 1102 during this period. At the end of the 10 ms period, the controller is ready to run the next routine, disables sleep mode, and de-asserts the sleep signal.

For example, in an embodiment where the output of the multiplexer 1104 is specified to be $OUT_0$, $OUT_1$, where $OUT_0$ and $OUT_1$ are equal to the logic level high (non-limiting) in sleep mode, the desired output value is hardwired to voltage source $V_{DD}$ (i.e., logic level high).

As another example, during sleep mode, the controller determines that the desired output (i.e., $OUT_0$, $OUT_1$, ..., $OUT_n$) is ten consecutive logic high signals (non-limiting), and the controller provides this value to the second input of the multiplexer 1104, which is the corresponding output signal of the multiplexer 1104.

It should be appreciated that, in embodiments, the integrated circuit may include more than one combination of the logic gates 1102, the multiplexer 1104, and the flip-flop 1106. For example, the integrated circuit 1100 may include an associated multiplexer 1104 for each logic gate of the logic gates 1102.

Figure 12:
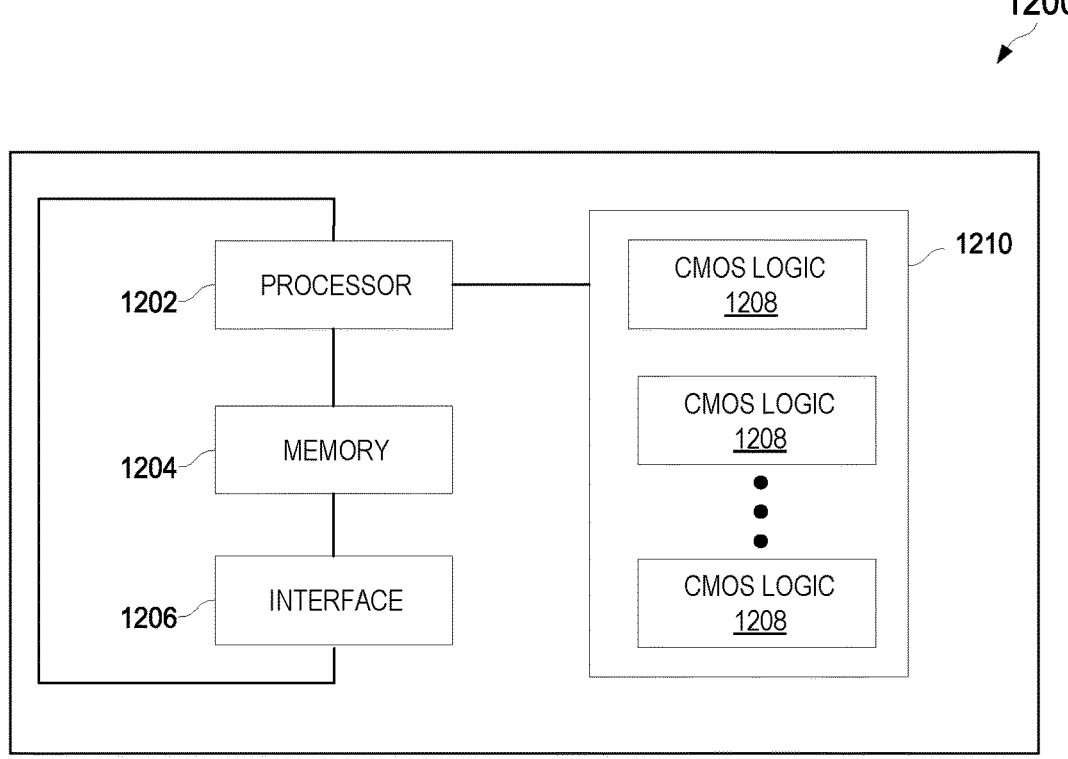
FIG. 12 is a block diagram of an embodiment processing system.

FIG. 12 illustrates a block diagram of an embodiment processing system 1200. As shown, the processing system 1200 includes a processor 1202, a memory 1204, an interface 1206, and an integrated circuit 1210, which may (or may not) be arranged as shown. Although the processing system 1200 is shown to have one of each component (i.e., the processor 1202, the memory 1204, the interface 1206, and the integrated circuit 1210), the number of components is not limiting and greater numbers are similarly contemplated in other embodiments. In such embodiments, the task performed by the component disclosed herein may be spread through these additional components.

The integrated circuit 1210 includes one or more logic gates 1208—although the processing system 1200 is shown with three logic gates 1208, the number of logic gates 1208 is non-limiting, and fewer or greater numbers can be included. The processing system 1200 may include additional components not depicted, such as long-term storage (e.g., non-volatile memory, etc.), measurement devices, feedback circuits, multiplexers, flip-flops, active and passive components, or the like.

Processor 1202 may be any component or collection of components adapted to perform computations or other processing-related tasks, as disclosed herein. Memory 1204 may be any component or collection of components adapted to store programming or instructions for execution by processor 1202. In an embodiment, memory 1204 includes a non-transitory computer-readable medium. Interface 1206 may be any component or collection of components that allow the processor 1202 to communicate with other devices/components or a user. For example, interface 1206 may be adapted to allow a user or device (e.g., personal computer (PC), etc.) to interact/communicate with the processing system 1200.

Figure 13:
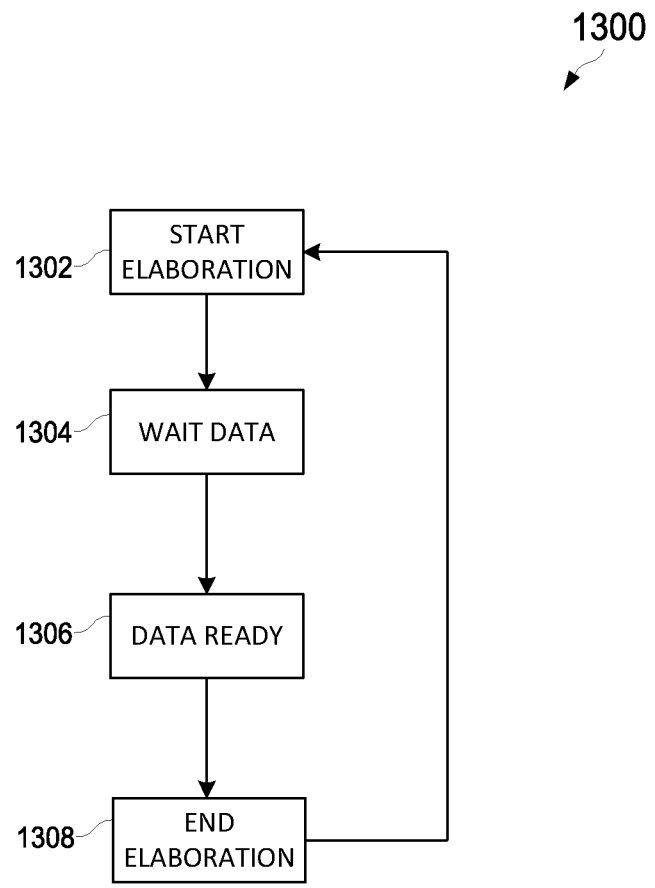
FIG. 13 is a flow chart of an embodiment method for enabling sleep mode and asserting the sleep signal at the sleep input terminal.

FIG. 13 illustrates a flow chart of an embodiment method 1300 for enabling sleep mode and asserting the sleep signal at the sleep input terminal (i.e., the gate of the series p-channel transistor and the shunt n-channel transistor, and the select terminal of the multiplexer). In embodiments, the processor 1202 is configured to drive one or more logic gates 1208 of the integrated circuit 1210 in the device 1200 into the different power modes. In embodiments, a controller or a power management unit (PMU) sets the different power modes. In embodiments, the integrated circuit 1210 may include multiple power domains, such as a RUN mode, a low-power, and a standby (or always-on) power domain.

The device 1200 may switch between the different power domains to achieve energy efficiency. The standby power domain has very low power consumption and remains ON after the device 1200 is powered up. This allows the device 1200 to enter standby mode until, for example, a user's input triggers an end to the standby mode. The low-power power domain allows the device 1200 to operate in low-power mode—the low-power power domain is OFF in the standby mode. This allows the device 1200 to perform certain functions at reduced power consumption. The RUN mode power domain is typically used for performing full-power operations when the maximum performance of the device 1200 is required. The RUN power domain is OFF in the low-power and standby modes.

At step 1302, one or more logic gates 1208 begin running a routine. In embodiments, the device 1200 is in an idle state at step 1302. In embodiments, the processor 1202 is configured to set the corresponding logic gates into sleep mode by asserting the sleep signal at the gate inputs of the associated series p-channel transistor 806 and shunt n-channel transistor 808.

At step 1304, in response to a delay in receiving the data inputs before processing the routine, processor 1202 sets the corresponding logic gates into sleep mode by asserting the sleep signal at the gate inputs of the associated series p-channel transistor 806 and shunt n-channel transistor 808. During this step, the multiplexer 1104 is configured to receive the asserted sleep signal, and the output of the multiplexer 1104 is set to the desired output value, which is, for example, hardwired to the second input of the multiplexer 1104.

At step 1306, after the delay period, the data inputs are ready at the corresponding logic gates. The processor 1202 sets the corresponding logic gates out of sleep mode and into, for example, full power mode, and the sleep signal at the gate inputs of the associated series p-channel transistor 806 and shunt n-channel transistor 808 are de-asserted.

At step 1308, at the conclusion of the routine, in embodiments, the processor 1202 sets the corresponding logic gates into sleep mode by asserting the sleep signal at the gate inputs of the associated series p-channel transistor 806 and shunt n-channel transistor 808. In embodiments, the processor 1202 sets the device 1200 into an idle state. In embodiments, at the conclusion of the routine at step 1308, the one or more logic gates 1208 being the processing of a next routine at step 1302.

It is noted that all steps outlined in the flow chart are not necessarily required and can be optional. Further, changes to the arrangement of the steps, removal of one or more steps and path connections, and addition of steps and path connections are similarly contemplated.

A first aspect relates to an integrated circuit. The integrated circuit includes a complementary metal-oxide-semiconductor (CMOS) logic gate, a series p-channel transistor, and a shunt n-channel transistor. The CMOS logic gate includes a first p-channel transistor and a first n-channel transistor. The first p-channel transistor and the series p-channel transistor are configurable to be body biased. The series p-channel transistor is coupled between an output terminal of the CMOS logic gate and the first p-channel transistor. The shunt n-channel transistor is coupled between the output terminal of the CMOS logic gate and the reference ground. A gate terminal of the series p-channel transistor is coupled to a gate terminal of the shunt n-channel transistor and configured to receive a sleep signal during a low-power operating mode of the CMOS logic gate.

In a first implementation form of the integrated circuit, according to the first aspect as such, the first p-channel transistor and the series p-channel transistor are coupled in series between a voltage source terminal of the CMOS logic gate and the output terminal of the CMOS logic gate. The first n-channel transistor and the shunt n-channel transistor are coupled in parallel between the output terminal of the CMOS logic gate and the reference ground.

In a second implementation form of the integrated circuit, according to the first aspect as such or any preceding implementation form of the first aspect, a body bias voltage is applied to the first p-channel transistor and the series p-channel transistor to body bias the first p-channel transistor and the series p-channel transistor.

In a third implementation form of the integrated circuit, according to the first aspect as such or any preceding implementation form of the first aspect, the CMOS logic gate includes a second p-channel transistor and a second n-channel transistor. The second p-channel transistor is configurable to be body biased. The first p-channel transistor, the second p-channel transistor, and the series p-channel transistor are arranged in series between a voltage source terminal of the CMOS logic gate and the output terminal of the CMOS logic gate. The first n-channel transistor, the second n-channel transistor, and the shunt n-channel transistor are coupled in parallel between the output terminal of the CMOS logic gate and the reference ground.

In a fourth implementation form of the integrated circuit, according to the first aspect as such or any preceding implementation form of the first aspect, the CMOS logic gate includes a second p-channel transistor and a second n-channel transistor. The second p-channel transistor is configurable to be body biased. The first p-channel transistor and the second p-channel transistor are arranged in parallel between a voltage source terminal of the CMOS logic gate and the series p-channel transistor. The first n-channel transistor, the second n-channel transistor, and the shunt n-channel transistor are coupled in parallel between the output terminal of the CMOS logic gate and the reference ground.

In a fifth implementation form of the integrated circuit, according to the first aspect as such or any preceding implementation form of the first aspect, the CMOS logic gate is a logic NAND gate, a logic NOR gate, a logic NOT gate, or a combination thereof.

In a sixth implementation form of the integrated circuit, according to the first aspect as such or any preceding implementation form of the first aspect, the integrated circuit includes a multiplexer with a first input terminal, a second input terminal, a select terminal, and an output terminal. The first input terminal is coupled to the output terminal of the CMOS logic gate, the second input terminal is couplable to a controller, and the select terminal is coupled to the sleep signal. The multiplexer is configured to set an output signal at the output terminal of the multiplexer to a signal at the first input terminal in response to the sleep signal being de-asserted and set an output signal at the output terminal of the multiplexer to a signal at the second input terminal in response to the sleep signal being asserted. The signal at the second input terminal is a desired output value.

A second aspect relates to a complementary metal-oxide-semiconductor (CMOS) logic gate. The CMOS logic gate includes a first p-channel transistor, a first n-channel transistor, a series p-channel transistor, and a shunt n-channel transistor. The first p-channel transistor is coupled between a voltage source terminal of the CMOS logic gate and an output terminal of the CMOS logic gate. The first p-channel transistor and the series p-channel transistor are configured to be body biased. The first n-channel transistor is coupled between the output terminal and reference ground. The series p-channel transistor is coupled between the output terminal and the first p-channel transistor. The shunt n-channel transistor is coupled between the output terminal and reference ground. A gate terminal of the series p-channel transistor is coupled to a gate terminal of the shunt n-channel transistor and configured to receive a sleep signal during a low-power operating mode of the CMOS logic gate.

In a first implementation form of the CMOS logic gate, according to the second aspect as such, the first p-channel transistor and the series p-channel transistor are coupled in series between the voltage source terminal and the output terminal. The first n-channel transistor and the shunt n-channel transistor are coupled in parallel between the output terminal and the reference ground.

In a second implementation form of the CMOS logic gate, according to the second aspect as such or any preceding implementation form of the second aspect, a body bias voltage is applied to the first p-channel transistor and the series p-channel transistor to body bias the first p-channel transistor and the series p-channel transistor.

In a third implementation form of the CMOS logic gate, according to the second aspect as such or any preceding implementation form of the second aspect, the CMOS logic gate further includes a second p-channel transistor and a second n-channel transistor. The second p-channel transistor is configured to be body biased. The first p-channel transistor, the second p-channel transistor, and the series p-channel transistor are arranged in series between the voltage source terminal and the output terminal. The first n-channel transistor, the second n-channel transistor, and the shunt n-channel transistor are coupled in parallel between the output terminal and the reference ground.

In a fourth implementation form of the CMOS logic gate, according to the second aspect as such or any preceding implementation form of the second aspect, the CMOS logic gate further includes a second p-channel transistor and a second n-channel transistor. The second p-channel transistor is configured to be body biased. The first p-channel transistor and the second p-channel transistor are arranged in parallel between the voltage source terminal and the series p-channel transistor. The first n-channel transistor, the second n-channel transistor, and the shunt n-channel transistor are coupled in parallel between the output terminal and the reference ground.

In a fifth implementation form of the CMOS logic gate, according to the second aspect as such or any preceding implementation form of the second aspect, the CMOS logic gate is a logic NAND gate, a logic NOR gate, a logic NOT gate, or a combination thereof.

A third aspect relates to a device having an integrated circuit. The integrated circuit includes a complementary metal-oxide-semiconductor (CMOS) logic gate, a series p-channel transistor, and a shunt n-channel transistor. The CMOS logic gate includes a first p-channel transistor and a first n-channel transistor. The first p-channel transistor and the series p-channel transistor are configurable to be body biased. The series p-channel transistor is coupled between an output terminal of the CMOS logic gate and the first p-channel transistor. The shunt n-channel transistor is coupled between the output terminal of the CMOS logic gate and the reference ground. A gate terminal of the series p-channel transistor is coupled to a gate terminal of the shunt n-channel transistor and configured to receive a sleep signal during a low-power operating mode of the CMOS logic gate.

In a first implementation form of the device, according to the third aspect as such, the first p-channel transistor and the series p-channel transistor are coupled in series between a voltage source terminal of the CMOS logic gate and the output terminal of the CMOS logic gate. The first n-channel transistor and the shunt n-channel transistor are coupled in parallel between the output terminal of the CMOS logic gate and the reference ground.

In a second implementation form of the device, according to the third aspect as such or any preceding implementation form of the third aspect, a body bias voltage is applied to the first p-channel transistor and the series p-channel transistor to body bias the first p-channel transistor and the series p-channel transistor.

In a third implementation form of the device, according to the third aspect as such or any preceding implementation form of the third aspect, the CMOS logic gate includes a second p-channel transistor and a second n-channel transistor. The second p-channel transistor is configurable to be body biased. The first p-channel transistor, the second p-channel transistor, and the series p-channel transistor are arranged in series between a voltage source terminal of the CMOS logic gate and the output terminal of the CMOS logic gate. The first n-channel transistor, the second n-channel transistor, and the shunt n-channel transistor are coupled in parallel between the output terminal of the CMOS logic gate and the reference ground.

In a fourth implementation form of the device, according to the third aspect as such or any preceding implementation form of the third aspect, the CMOS logic gate includes a second p-channel transistor and a second n-channel transistor. The second p-channel transistor is configurable to be body biased. The first p-channel transistor and the second p-channel transistor are arranged in parallel between a voltage source terminal of the CMOS logic gate and the series p-channel transistor. The first n-channel transistor, the second n-channel transistor, and the shunt n-channel transistor are coupled in parallel between the output terminal of the CMOS logic gate and the reference ground.

In a fifth implementation form of the device, according to the third aspect as such or any preceding implementation form of the third aspect, the CMOS logic gate is a logic NAND gate, a logic NOR gate, a logic NOT gate, or a combination thereof.

In a sixth implementation form of the device, according to the third aspect as such or any preceding implementation form of the third aspect, the integrated circuit further includes a multiplexer having a first input terminal, a second input terminal, a select terminal, and an output terminal. The first input terminal is coupled to the output terminal of the CMOS logic gate, the second input terminal is couplable to a controller, and the select terminal is coupled to the sleep signal. The multiplexer is configured to set an output signal at the output terminal of the multiplexer to a signal at the first input terminal in response to the sleep signal being deasserted and set an output signal at the output terminal of the multiplexer to a signal at the second input terminal in response to the sleep signal being asserted, wherein the signal at the second input terminal is a desired output value.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. An integrated circuit, comprising:
   a complementary metal-oxide-semiconductor (CMOS) logic gate including a first p-channel transistor and a first n-channel transistor, wherein the first p-channel transistor is configurable to be body biased;
   a series p-channel transistor coupled between an output terminal of the CMOS logic gate and the first p-channel transistor, wherein the series p-channel transistor is configurable to be body biased; and
   a shunt n-channel transistor coupled between the output terminal of the CMOS logic gate and reference ground, wherein a gate terminal of the series p-channel transistor is coupled to a gate terminal of the shunt n-channel transistor and configured to receive a sleep signal during a low-power operating mode of the CMOS logic gate.

2. The integrated circuit of claim 1, wherein the first p-channel transistor and the series p-channel transistor are coupled in series between a voltage source terminal of the CMOS logic gate and the output terminal of the CMOS logic gate, and wherein the first n-channel transistor and the shunt n-channel transistor are coupled in parallel between the output terminal of the CMOS logic gate and the reference ground.

3. The integrated circuit of claim 1, wherein a body bias voltage is applied to the first p-channel transistor and the series p-channel transistor to body bias the first p-channel transistor and the series p-channel transistor.

4. The integrated circuit of claim 1, wherein the CMOS logic gate includes a second p-channel transistor and a second n-channel transistor, wherein the second p-channel transistor is configurable to be body biased, wherein the first p-channel transistor, the second p-channel transistor, and the series p-channel transistor are arranged in series between a voltage source terminal of the CMOS logic gate and the output terminal of the CMOS logic gate, and wherein the first n-channel transistor, the second n-channel transistor, and the shunt n-channel transistor are coupled in parallel between the output terminal of the CMOS logic gate and the reference ground.

5. The integrated circuit of claim 1, wherein the CMOS logic gate includes a second p-channel transistor and a second n-channel transistor, wherein the second p-channel transistor is configurable to be body biased, wherein the first p-channel transistor and the second p-channel transistor are arranged in parallel between a voltage source terminal of the CMOS logic gate and the series p-channel transistor, and wherein the first n-channel transistor, the second n-channel transistor, and the shunt n-channel transistor are coupled in parallel between the output terminal of the CMOS logic gate and the reference ground.

6. The integrated circuit of claim 1, wherein the CMOS logic gate is a logic NAND gate, a logic NOR gate, a logic NOT gate, or a combination thereof.

7. The integrated circuit of claim 1, further comprising a multiplexer having a first input terminal, a second input terminal, a select terminal, and an output terminal, wherein the first input terminal is coupled to the output terminal of the CMOS logic gate, wherein the second input terminal is couplable to a controller, wherein the select terminal is coupled to the sleep signal, and wherein the multiplexer is configured to:

set an output signal at the output terminal of the multiplexer to a signal at the first input terminal in response to the sleep signal being de-asserted; and set an output signal at the output terminal of the multiplexer to a signal at the second input terminal in response to the sleep signal being asserted, wherein the signal at the second input terminal is a desired output value.

8. A complementary metal-oxide-semiconductor (CMOS) logic gate, comprising:

a first p-channel transistor coupled between a voltage source terminal of the CMOS logic gate and an output terminal of the CMOS logic gate, the first p-channel transistor configured to be body biased;

a first n-channel transistor coupled between the output terminal and reference ground;

a series p-channel transistor coupled between the output terminal and the first p-channel transistor, wherein the series p-channel transistor is configured to be body biased; and a shunt n-channel transistor coupled between the output terminal and reference ground, wherein a gate terminal of the series p-channel transistor is coupled to a gate terminal of the shunt n-channel transistor and configured to receive a sleep signal during a low-power operating mode of the CMOS logic gate.

9. The CMOS logic gate of claim 8, wherein the first p-channel transistor and the series p-channel transistor are coupled in series between the voltage source terminal and the output terminal, and wherein the first n-channel transistor and the shunt n-channel transistor are coupled in parallel between the output terminal and the reference ground.

10. The CMOS logic gate of claim 8, wherein a body bias voltage is applied to the first p-channel transistor and the series p-channel transistor to body bias the first p-channel transistor and the series p-channel transistor.

11. The CMOS logic gate of claim 8, further comprising a second p-channel transistor and a second n-channel transistor, wherein the second p-channel transistor is configured to be body biased, wherein the first p-channel transistor, the second p-channel transistor, and the series p-channel transistor are arranged in series between the voltage source terminal and the output terminal, and wherein the first n-channel transistor, the second n-channel transistor, and the shunt n-channel transistor are coupled in parallel between the output terminal and the reference ground.

12. The CMOS logic gate of claim 8, further comprising a second p-channel transistor and a second n-channel transistor, wherein the second p-channel transistor is configured to be body biased, wherein the first p-channel transistor and the second p-channel transistor are arranged in parallel between the voltage source terminal and the series p-channel transistor, and wherein the first n-channel transistor, the second n-channel transistor, and the shunt n-channel transistor are coupled in parallel between the output terminal and the reference ground.

13. The CMOS logic gate of claim 8, wherein the CMOS logic gate is a logic NAND gate, a logic NOR gate, a logic NOT gate, or a combination thereof.

14. A device, comprising an integrated circuit, the integrated circuit having:

a complementary metal-oxide-semiconductor (CMOS) logic gate including a first p-channel transistor and a first n-channel transistor, wherein the first p-channel transistor is configurable to be body biased;

a series p-channel transistor coupled between an output terminal of the CMOS logic gate and the first p-channel transistor, wherein the series p-channel transistor is configurable to be body biased; and a shunt n-channel transistor coupled between the output terminal of the CMOS logic gate and reference ground, wherein a gate terminal of the series p-channel transistor is coupled to a gate terminal of the shunt n-channel transistor and configured to receive a sleep signal during a low power operating mode of the CMOS logic gate.

15. The device of claim 14, wherein the first p-channel transistor and the series p-channel transistor are coupled in series between a voltage source terminal of the CMOS logic gate and the output terminal of the CMOS logic gate, and wherein the first n-channel transistor and the shunt n-channel transistor are coupled in parallel between the output terminal of the CMOS logic gate and the reference ground.

16. The device of claim 14, wherein a body bias voltage is applied to the first p-channel transistor and the series p-channel transistor to body bias the first p-channel transistor and the series p-channel transistor.

17. The device of claim 14, wherein the CMOS logic gate includes a second p-channel transistor and a second n-channel transistor, wherein the second p-channel transistor is configurable to be body biased, wherein the first p-channel transistor, the second p-channel transistor, and the series p-channel transistor are arranged in series between a voltage source terminal of the CMOS logic gate and the output terminal of the CMOS logic gate, and wherein the first n-channel transistor, the second n-channel transistor, and the shunt n-channel transistor are coupled in parallel between the output terminal of the CMOS logic gate and the reference ground.

18. The device of claim 14, wherein the CMOS logic gate includes a second p-channel transistor and a second n-channel transistor, wherein the second p-channel transistor is configurable to be body biased, wherein the first p-channel transistor and the second p-channel transistor are arranged in parallel between a voltage source terminal of the CMOS logic gate and the series p-channel transistor, and wherein the first n-channel transistor, the second n-channel transistor, and the shunt n-channel transistor are coupled in parallel between the output terminal of the CMOS logic gate and the reference ground.

19. The device of claim 14, wherein the CMOS logic gate is a logic NAND gate, a logic NOR gate, a logic NOT gate, or a combination thereof.

20. The device of claim 14, wherein the integrated circuit further comprises a multiplexer having a first input terminal, a second input terminal, a select terminal, and an output terminal, wherein the first input terminal is coupled to the output terminal of the CMOS logic gate, wherein the second input terminal is couplable to a controller, wherein the select terminal is coupled to the sleep signal, and wherein the multiplexer is configured to:

set an output signal at the output terminal of the multiplexer to a signal at the first input terminal in response to the sleep signal being de-asserted; and set an output signal at the output terminal of the multiplexer to a signal at the second input terminal in response to the sleep signal being asserted, wherein the signal at the second input terminal is a desired output value.

* * * * *